United States Patent
Cheema et al.

(10) Patent No.: US 12,355,422 B2
(45) Date of Patent: *Jul. 8, 2025

(54) SAW DEVICE WITH IMPROVED THERMAL MANAGEMENT

(71) Applicant: RF360 SINGAPORE PTE. LTD, Republic Plaza (SG)

(72) Inventors: Kamran Cheema, Apopka, FL (US); Bambang Kunardi, Singapore (SG); Yu Jen Chong, Singapore (SG); Chong Choon Lee, Singapore (SG)

(73) Assignee: RF360 Singapore Pte. Ltd., Republic Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/751,019

(22) Filed: Jun. 21, 2024

(65) Prior Publication Data

US 2024/0421794 A1 Dec. 19, 2024

Related U.S. Application Data

(63) Continuation of application No. 17/431,411, filed as application No. PCT/EP2020/051799 on Jan. 24, 2020, now Pat. No. 12,034,429.

(30) Foreign Application Priority Data

Feb. 27, 2019 (DE) ..................... 10 2019 104 993.8

(51) Int. Cl.
*H03H 9/02* (2006.01)
*H03H 9/64* (2006.01)

(52) U.S. Cl.
CPC .... *H03H 9/02834* (2013.01); *H03H 9/02992* (2013.01); *H03H 9/6483* (2013.01)

(58) Field of Classification Search
CPC ........... H03H 9/02834; H03H 9/02992; H03H 9/6483; H03H 3/10; H03H 9/02921; H03H 9/0542

(Continued)

(56) References Cited

U.S. PATENT DOCUMENTS 9,077,312 B1 7/2015 Costa et al.
9,231,553 B2 1/2016 Inoue et al.

(Continued)

FOREIGN PATENT DOCUMENTS

CN 102804600 A 11/2012
DE 10057848 A1 5/2002

(Continued)

OTHER PUBLICATIONS

International Preliminary Report on Patentability—PCT/EP2020/051799—The International Bureau of WIPO—Geneva, Switzerland—Sep. 10, 2021.

(Continued)

*Primary Examiner* — Jorge L Salazar, Jr.
(74) *Attorney, Agent, or Firm* — Polsinelli

(57) ABSTRACT

Aspects herein include minimizing hot spots on a filter chip by creating thermal radiators using mechano-acoustic structures and connection circuitry. A gradual increase of metal to wafer relation provides better heat dissipation and heat sinking. Shunt lines of a ladder type arrangement of SAW resonators comprise a broadened section. Resonators that are subsequent to each other in the series signal line are connected via a common busbar extending over a length of subsequent series resonators. A lateral extension of the common busbars represents a first section of a respective shunt line. A first shunt line section between a node and the parallel resonator of a shunt line comprises a section that is broader than the common busbar, the broadened section (Continued)

extending over the width of the parallel resonator. The first reflector of the parallel resonator that faces the laterally adjacent series resonator is formed from the broadened section.

14 Claims, 7 Drawing Sheets

(58) Field of Classification Search
USPC .......................................... 333/133, 193–196
See application file for complete search history.

(56) References Cited

U.S. PATENT DOCUMENTS

| 12,034,429 B2* | 7/2024 | Cheema ............. H03H 9/02992 |
| 2002/0140519 A1 | 10/2002 | Takayama et al. |
| 2003/0214372 A1 | 11/2003 | Miura et al. |
| 2007/0278898 A1 | 12/2007 | Miura et al. |
| 2010/0148887 A1 | 6/2010 | Matsuda et al. |
| 2012/0105298 A1 | 5/2012 | Inoue et al. |
| 2016/0112030 A1 | 4/2016 | Kaneda et al. |
| 2016/0173060 A1 | 6/2016 | Hatakeyama et al. |
| 2017/0141758 A1 | 5/2017 | Ajima |
| 2022/0140807 A1 | 5/2022 | Cheema et al. |

FOREIGN PATENT DOCUMENTS

| JP | H0998046 A | 4/1997 |
| JP | H11312944 A | 11/1999 |
| JP | 2000114923 A | 4/2000 |
| JP | 2009218762 A | 9/2009 |

OTHER PUBLICATIONS

International Search Report and Written Opinion—PCT/EP2020/051799—ISA/EPO—Apr. 24, 2020.

* cited by examiner

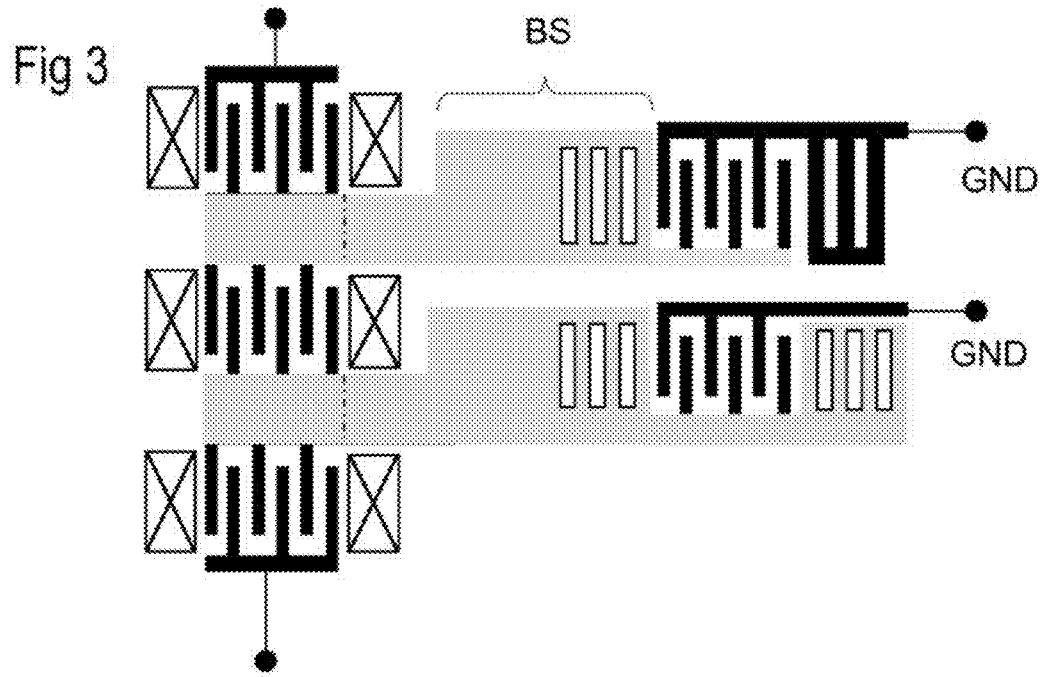
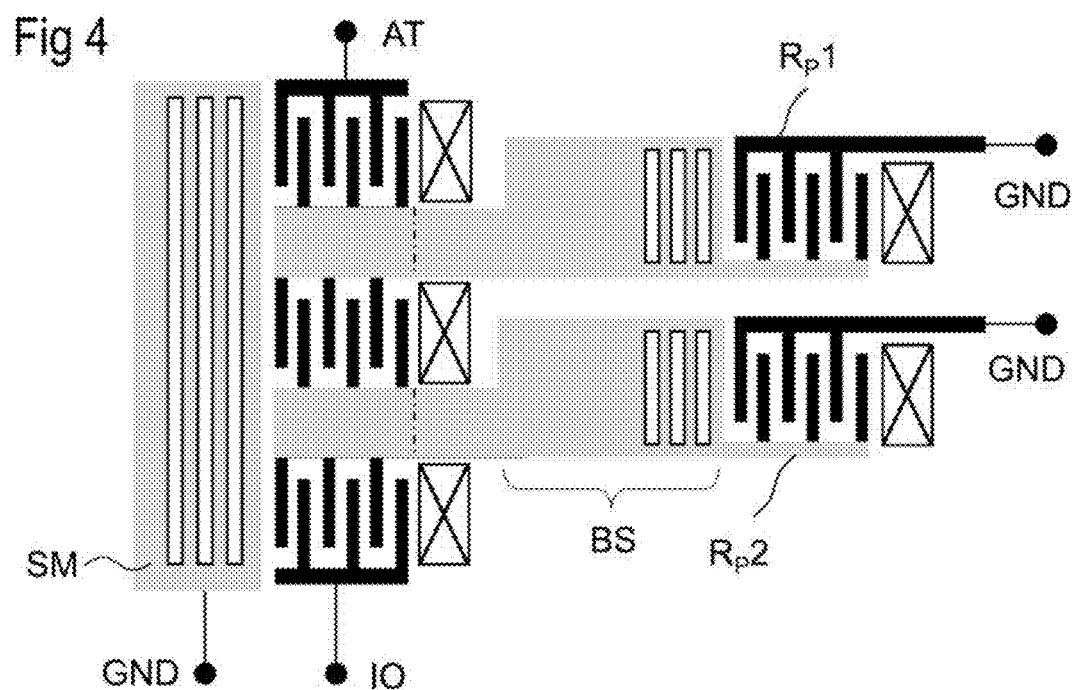

Fig 11

| Temp | Pin |||||||||
| | Control ||| Bsp. 1 ||| Bsp. 2 |||
| | Slight | Severe | Nose Diving | Slight | Severe | Nose Diving | Slight | Severe | Nose Diving |
| 25C | 28,5 | 30,5 | 31,2 | 30,5 | 30,5 | 31,5 | 31 | 31,2 | 31,6 |
| 50C | 28,5 | 29 | 30,5 | 28,5 | 30,5 | 31,6 | 30 | 30,5 | 31,2 |
| 85C | 28,5 | 29 | 28,8 | 29 | 30 | 30,4 | 29 | 29,8 | 30 |

SAW DEVICE WITH IMPROVED THERMAL MANAGEMENT

CROSS-REFERENCE TO RELATED APPLICATIONS

This application for Patent is a continuation of U.S. application Ser. No. 17/431,411, filed Aug. 16, 2021, which is a 371 National Stage Entry of international Patent Application PCT/EP2020/051799, filed Jan. 24, 2020, which claims priority to German Patent Application 10 2019 104 993.8, filed Feb. 27, 2019, all of which are hereby incorporated by referenced in their entirety and for all purposes.

DESCRIPTION

The HPUE application (HPUE=High Power User Equipment, a special class of user equipment for the LTE cellular network) and up-coming 5G implementation are highly demanding on the RF components in terms of high power handling and reliability. HPUE is allowed to transmit with an output power of up to 31 dBm.

Acoustic filters used for that type of mobile communication use ladder type structures of SAW resonators that can operate higher power signals. Respective acoustic filter chip must handle power of more than 1W and as a further hurdle are currently demanding a smaller chip size. Filters for high power levels require a thermal management that enables the acoustic chip to avoid early power compression at too high power levels.

When power is subjected at the input of a filter/duplexer/multiplexer and observed at the output power, an ideal relationship between input Pin and output power Pout should be linear. Which means the behavior should be $$Pin=(alpha)*Pout,$$

where alpha is a constant loss of the passive filter device. However, this linear relationship breaks down when excessive power is injected and output power starts to saturate. This power saturation leads to very high localized temperature gradients that must be managed to prevent device failure.

It is hence an object of the present invention to provide a filter device with improved thermal management that minimizes the risk of sudden thermal rise.

This and other objects are met by a SAW filter device according to the independent claim. Advantageous features and embodiments are given by dependent claims.

A general idea is to solve the problem without any variation of the acoustic properties hence without any impact on these properties that is simply by employing chip layout techniques. According to the invention a SAW filter device is provided having a ladder type structure of SAW resonators. This filter type consists of a substantial number of resonators and a lot of circuitry between different resonators and between the resonators and respective terminals. Hence, many freedoms of variation the layout exist.

The thermal management of an acoustic chip like a SAW filter device needs at first carefully analysing possible heat generating mechanisms. Three mechanisms can be found that include first order DC resistance of the connection circuitry, RF resistance, and coupling of electromechanical energy to the piezo material.

This invention focuses on minimizing the hot spots on the chip by creating thermal radiators using the mechano-acoustic structures and connection circuitry. In the case of a filter, duplexer or multiplexer, a gradual increase of metal to wafer relation is made to provide better heat dissipation and heat sinking.

The SAW filter device has a ladder type structure. A series signal line connects an antenna terminal and an I/O terminal for inputting and outputting signals. In the series signal line a number of series resonators is arranged. Nodes are situated in the series signal line between each two series resonators. Shunt lines are connected to a respective node each and a parallel resonator is arranged respectively in a shunt line.

Here and in the following a length of a resonator should be understood to refer to a length measured in a longitudinal direction complying with the wave propagation direction. Similarly a width of a resonator is measured in a transversal direction normal to the longitudinal direction.

Each two series resonators that are arranged subsequent to each other in the series signal line are connected via a metallized area that is referred to as a common busbar extending over a whole length of that two subsequent series resonators.

A lateral extension of the common busbars represents a first section of a respective shunt line each. A first shunt line section defined as a section between a node and the respective parallel resonator comprises a broadened section that has a width broader than that of the common busbar. It is as broad that it extends over the whole width of the parallel resonator, thereby filling nearly the whole space between adjacent series resonator, signal line and parallel resonator. Advantageously the first reflector of the parallel resonator that faces the laterally adjacent series resonator is formed from the metallization of the broadened section.

Simply by this means the metallized area on the surface of the filter chip that is the surface of the SAW filter device is substantially enhance and hence an improved heat sink is provided without the need of increasing the size of the SAW filter device.

For a better power resistance those series resonators that are arranged between a first and a last node in the series signal line may be twofold cascaded by means of a connecting busbar interposed between the cascaded single resonators. The connecting busbar is made broader than necessary for current guiding purpose and has a width of at least 10 μm. Normally such a connecting busbar between two cascaded resonators has a width as small as necessary of about 2 μm or smaller.

According to an embodiment the metallization of the lateral extension of a common busbar is used to form a first reflector, a first busbar and a second reflector of the respective parallel resonator in the respective shunt line. Here too, the metallized area "around" the parallel resonator is maximized and associated with the respective improvement of heat dissipation and heat sinking.

If a parallel resonator has a first reflector and a first busbar formed by the first section of the shunt line the respective second busbar and a second reflector can be formed by a second section of the shunt line.

According to an embodiment those series resonators arranged between a first and a last node in the series signal line are lined-up one below the other in a line parallel to the transversal direction. Hence, the series signal line extends substantially parallel to the transversal direction. All shunt lines extend from the series signal line in a second direction complying with the longitudinal direction. The reflectors of the lined-up series resonators that face away from the shunt lines to the first direction are formed from a strip-type metallization that extends over the whole length of the lined-up series resonators with nearly constant width when measured in a transversal direction and have a width that amounts to at least the width of the respective reflectors that are formed in the strip-type metallization. A connection of the strip-type metallization to a ground terminal further improves the heat sinking and thermal dissipation by providing a further heat dissipation path.

In another embodiment all series resonators that are arranged between the first and the last node in the series signal line are cascaded, each cascade comprising a series connection of two single resonators. In each of these series resonators cascades, the second reflectors facing to the second direction are common to both single resonators and are extending over the total width of the two single resonators. These reflectors are connected to the respective common busbar and are isolated from any other potential or from a ground terminal.

In all embodiments the second reflector of the last series resonator facing to the second direction, the second busbar next to the I/O terminal and the I/O terminal as well are formed from the same metallization and/or are connected to the same electric potential. Further, this metallization may be elongated to extend away from the second busbar along the longitudinal direction for a length that is longer than the width of the reflector.

Those series resonators that are arranged between the first and the last node in the series signal line may be cascaded each by a series connection of two single resonators. All first and second reflectors of the single resonators may then be electrically isolated against each other and not connected to any line or external potential.

All second sections of the shunt lines are connected to a common grounded area that has a width in the longitudinal direction of at least those of the second reflectors of the parallel resonators.

The SAW filter device may be designed as a TX filter wherein the I/O terminal is the Tx terminal. The last series resonator next to the TX terminal is not cascaded and has a length that is at least the twofold length of a remaining series resonator.

The benefit the new SAW filter device is that under rapid change of power, the heat is better spread out in the SAW filter chip thereby eliminating hot spots that can damage the chip. For achieving this advantage no new process is required and the same package as for currently used SAW devices can be used. It has an improved power compression performance that is compared to former devices identical and slightly better for small signals.

In the following the invention will be explained in more detail with reference to specific embodiments and the accompanied figures. The figures are schematic only and drawn to scale. Hence, neither exact relative nor absolute measures can be taken from the figures.

FIG. 1 shows a SAW filter device where a first section of a shunt line has a broadened section, FIG. 2 shows a cascade of two single resonators that can replace a resonator in a ladder type arrangement of the filter device, FIG. 3 shows a SAW filter device with two representative shunt lines having different design where first and second reflector of the parallel resonators are coupled to different busbars of the resonator, FIG. 4 shows a SAW filter device with a striplike metallization and reflectors for the series resonators formed therein, FIG. 5 is a block diagram of a TX SAW filter device FIG. 6 compares transfer curves of a control example and two embodiments, FIG. 7 show the reflectivity of the filter in the lower stop band, FIG. 8 shows the compression of the filter devices measured at 50° C. and at 915 MHZ, FIG. 9 shows the compression of the filter devices measured at 50° C. and 25° C., FIG. 10 shows the compression of the filter devices measured at 25° C., 50° C. and 85° C. when applying a continuous wave signal at 912.5 MHz, FIG. 11 shows a table with threshold temperatures measured at the examples when slightly compressed, severely compressed and breakdown.

FIG. 5 shows a schematic block diagram of a TX SAW filter device embodied with SAW resonators having a ladder type arrangement. The shown filter consists of a substantial number of resonators and a lot of circuitry between different resonators as well as between the resonators and respective terminals. Hence, many freedoms of variation exist for the layout. A series signal line connects an antenna terminal AT and an I/O terminal IO for inputting and outputting signals which is in the example a terminal TX for inputting transmit signals. In the series signal line a number of series resonators RS is arranged. The example of FIG. 5 has four series resonators RSi to RS4. Nodes N1 to N3 are situated in the series signal line between each two subsequent series resonators. Shunt lines SL are connected to a respective node N each and a parallel resonator RP each is arranged in a respective shunt line SL. A first section SLS1 of each shunt line SL connects a node N and a respective parallel resonator RP. A second section SLS2 of each shunt line SL connects that parallel resonator RP to a ground terminal GND. Preferably all shunt lines are combined at a node NS on the chip to be commonly connected to the same ground terminal GND. However, one or more of the shunt lines SL can also be connected to separate ground terminals GND before they are connected to ground separately according to the design requirements.

The first three series resonators RS1 to RS3 are twofold cascaded and each cascade comprises a series connection of two single resonators SR1, SR2 as shown in FIG. 2). The fourth series resonator is not cascaded and has an extended length larger than that of the remaining three resonators.

Usually all circuitry of a known filter as shown in FIG. 5 is dimensioned as required for effective conductivity and low ohmic loss. Such a design is taken as a reference and called a control example.

FIG. 1 shows a schematic SAW filter structure according to the invention. For simplicity reasons only two shunt lines SL are depicted while three shunt lines according to the control example and more are also possible. Same is true for the number of series resonators RS and the possible or preferred cascading thereof that is not explicitly depicted in FIG. 1. Different to the control example two subsequent series resonators are connected by a common busbar BBCN that has a lateral extension forming the first section SLS1 of a shunt line SL. Each such first section SLS1 has a broadened section BS with a width that is higher than the width of the common busbar BBCN. The width is measured along the transversal direction TD indicated in the figure with according arrows.

In the broadened section of each shunt line a first reflector REF1 for the respective parallel resonator RP is formed. Usually a reflector REF comprises a reflective grid embodied in a regular pattern of reflective metallic stripes. The respective second reflector REF2 of each parallel resonator RP may also be connected to the first section of the shunt line. Alternatively it may be electrically floating or preferably connected to the second busbar of the resonator and the second section SLS2 of the shunt line SL.

The reflectors REF of the series resonators are shown schematically only. The ones facing the second direction that is facing the shunt lines are preferably floating and not connected to an external or otherwise fixed potential. Further, cascades of single resonators SR may share the same reflector. The same is true for the reflectors facing to the first direction away from the shunt lines.

FIG. 2 shows two cascaded single resonators SRI, SR2 connected by a connecting busbar BBCC. In a preferred example (like in later examples 1 and 2) the connecting busbar BBCC has a width WBB of at least bourn. The two cascaded single resonators SR can substitute any or all series resonators RS, the latter being preferred.

FIG. 3 shows a filter device similar to that of FIG. 1. Here, different possibilities of connecting and forming a second reflector REF2 that is the reflector facing to the second direction are shown. In the top shunt line the second reflector of the parallel resonator is connected to the second busbar that is in the figure the top busbar. Accordingly the second section of the shunt line is connected to the second busbar. In the bottom shunt line of the figure the second reflector is formed from the laterally extended connecting busbar and is hence connected to the first busbar and to the first section SLS2.

FIG. 4 is similar to FIGS. 1 and 3. Here the first reflectors of the series resonators SR are formed from a striplike metallization SM that extends over the total length of the series resonators. For this purpose those series resonators RS arranged between a first and a last node N in the series signal line are lined-up one below the other in a line parallel to the transversal direction TD such that at least the first ends of the resonators flush with each other. In the shown embodiment the striplike metallization SM is connected to ground terminal GND.

FIG. 6 shows the signal transmission in the pass band area of a Tx filter optimized for band 8. Curve 1 accords to the transmission of a control example with usual conductor lines. Curves 2 is assigned to a first example that has a striplike metallization SM as shown in FIG. 4 while the second example according to curve 3 has normal reflectors at the first side of the series resonators and separate for each series resonator. It is shown that the three examples show similar transmission characteristic.

FIG. 7 shows the reflectivity of the filter devices above in the lower stop band. First and second example have higher reflection in the depicted frequency range that is due to lower ohmic losses compared to the control example.

FIG. 8 shows the respective compression measured at 50° C. at 915 MHz that is at the upper right edge of the passband. The signal of the control example according to curve 1 starts compressing at the lowest input power Pin of about 28.5 dBm. First example starts compressing at 29.5 dBm and first example at about 0.3 dBm lower. This due to the higher loss that occurs at the control example.

FIG. 9A accords to the control example while FIGS. 9B and 9C accord to first and second example.

FIG. 11 is a table showing the threshold values for input power PIN where slight, severe and nose diving compression is regarded. "Nose diving" is an expression that means a breakdown condition where a resonator will be damaged due to voltage breakdown.

Figure 1:
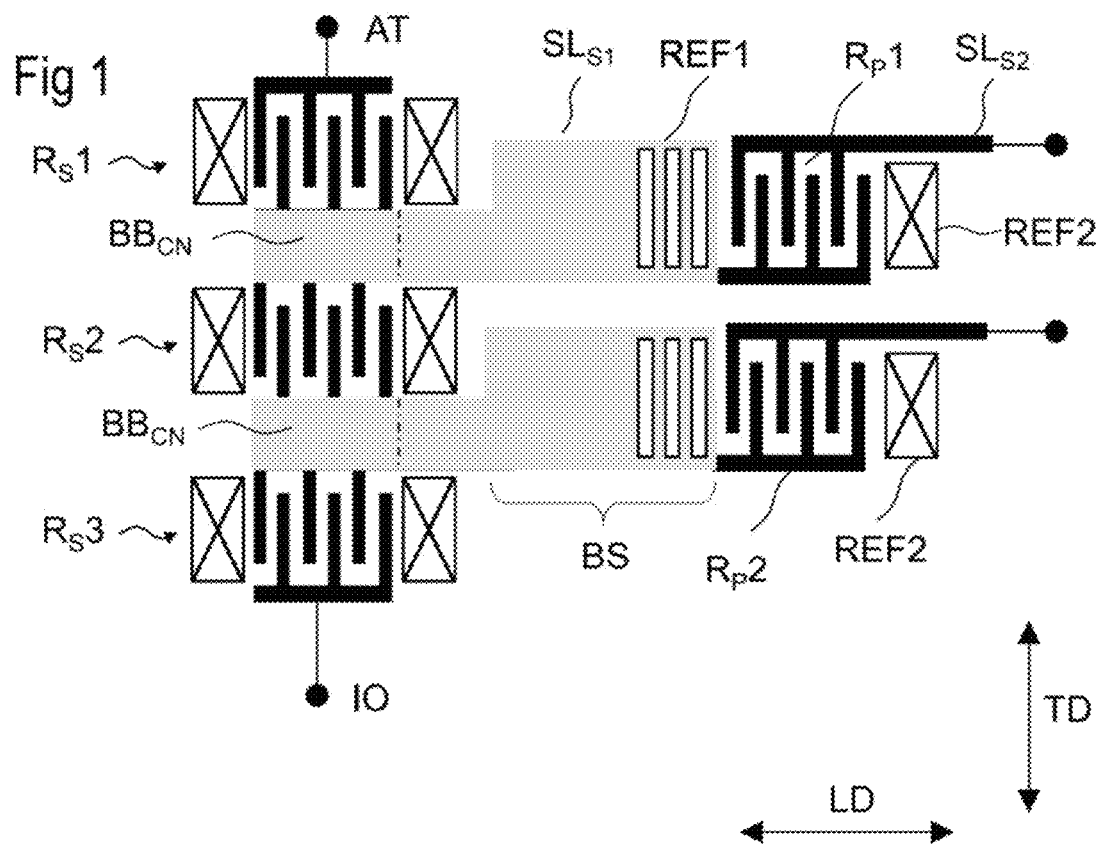
Figure 2:
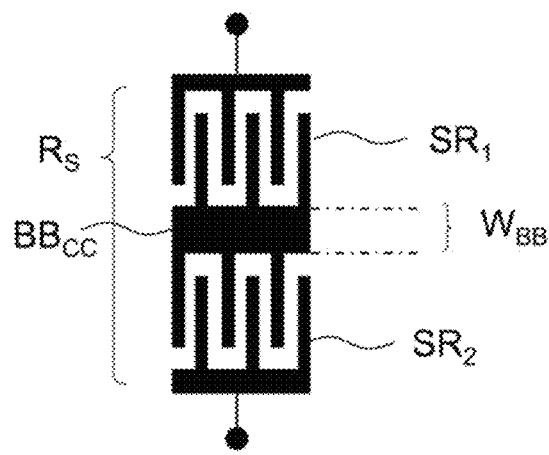
Figure 5:
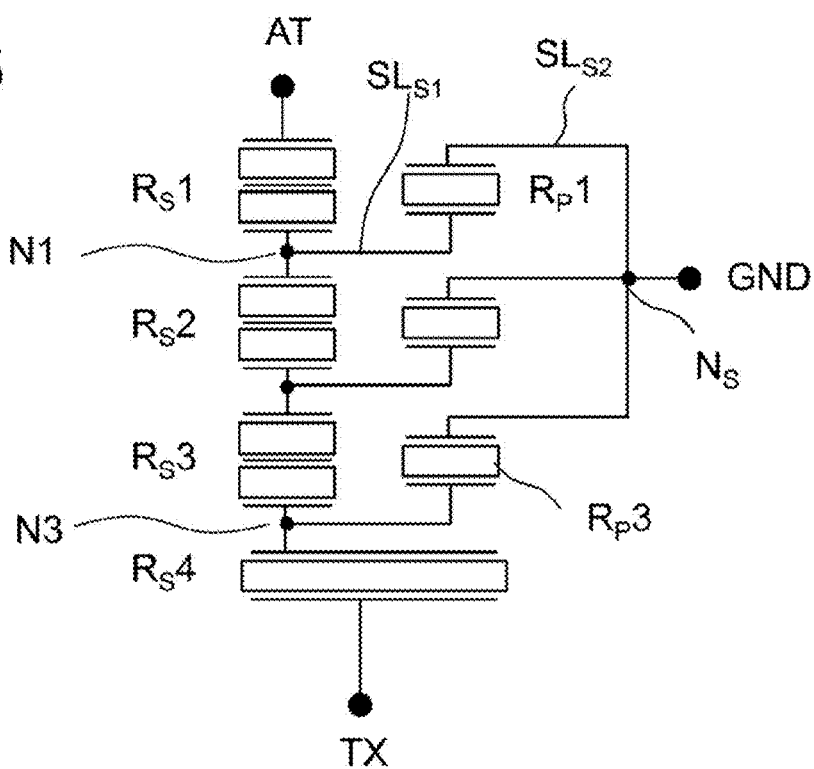
Figure 6:
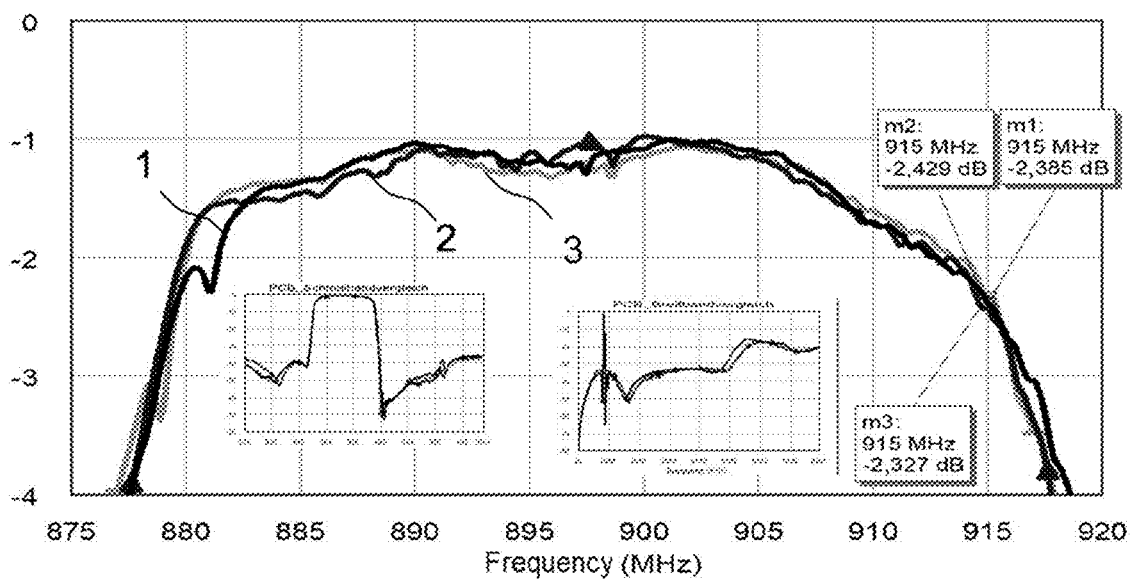
Figure 7:
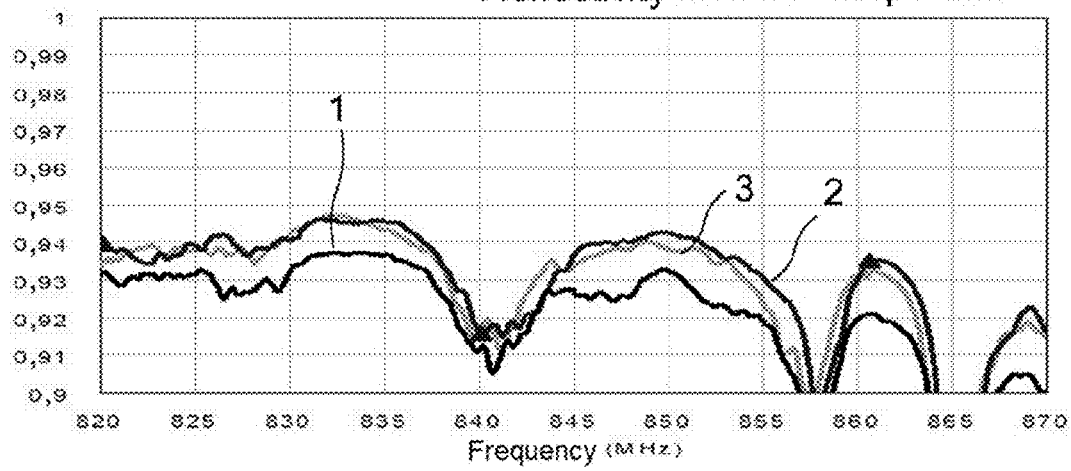
Figure 8:
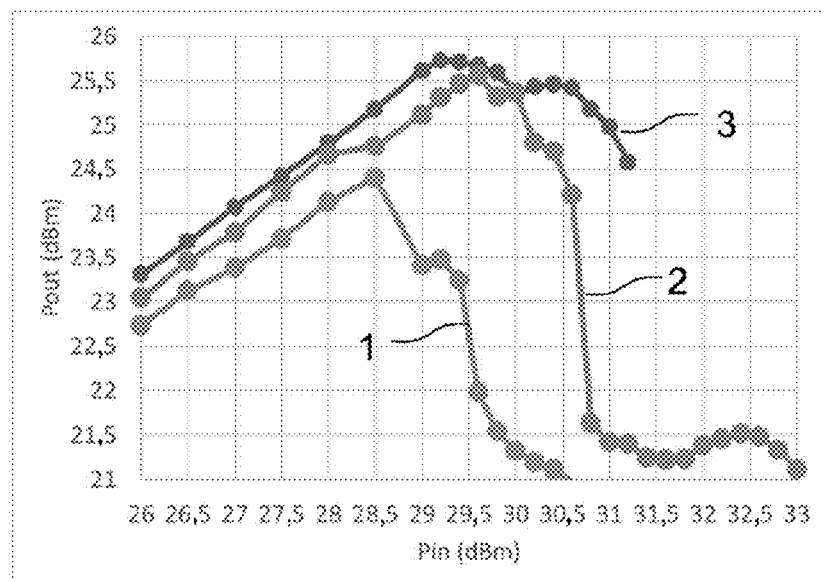
Figure 9:
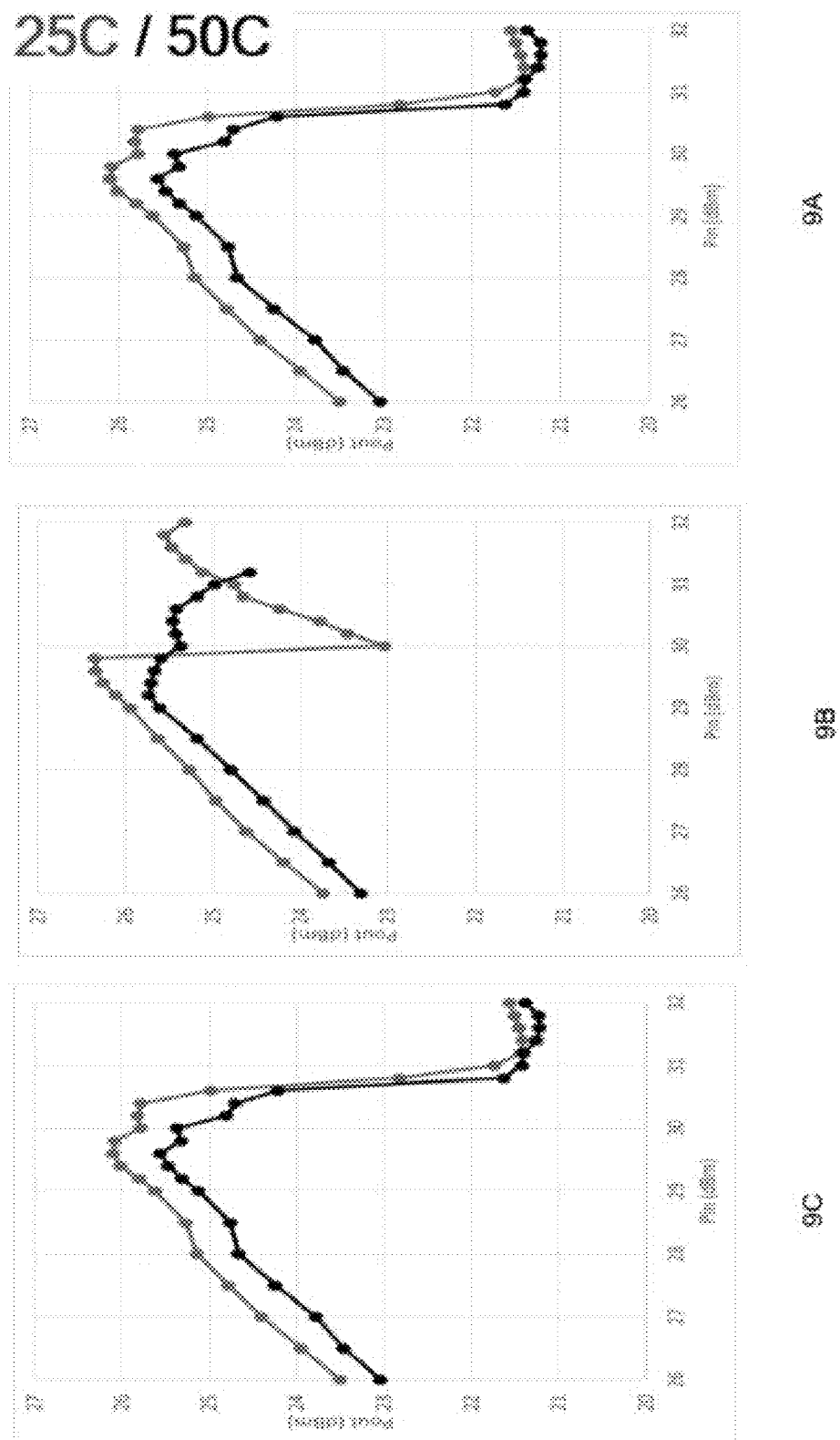
FIG. 9 shows the respective compression measured at two different temperatures at 50° C. and 25° C. when applying a continuous wave signal at 915 MHz.
Figure 10:
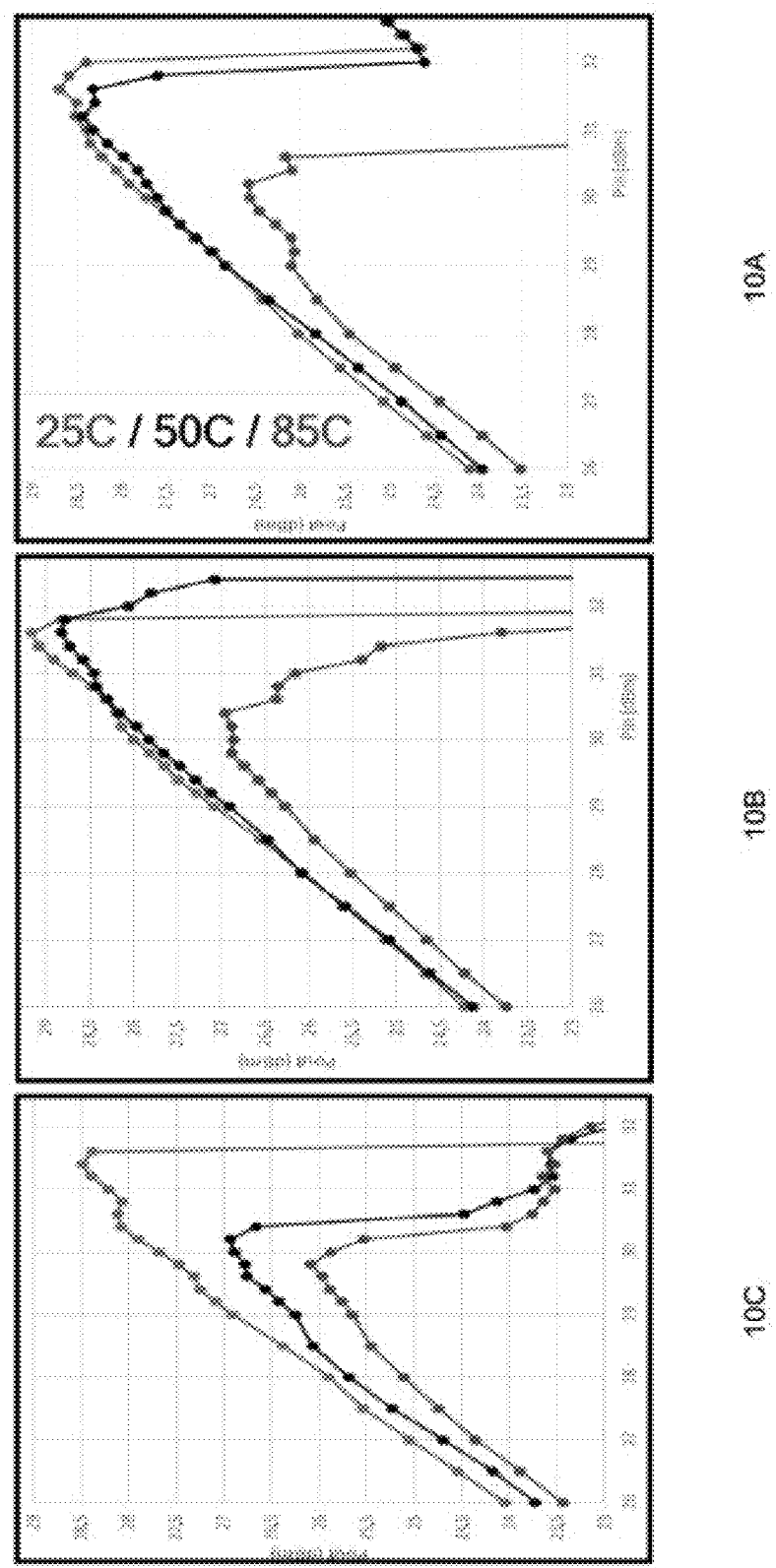
FIG. 10 shows the respective compression measured at three different temperatures at 85° C., 50° C. and 25° C. for the same examples.

The invention has been explained with reference do different separate features. However, real filter devices can show single ones or more of the features realized in different and arbitrary combinations without leaving the scope of the invention.

LIST OF USED REFERENCE SYMBOLS 1,2,3 example nos.
AT antenna terminal
BB busbar
BBCN common busbar
BBCN connecting busbar
BS broadened section of first shunt line section
GND ground terminal
IO IO terminal
LD longitudinal direction
N node
N1 first node in the series signal line next to antenna
NS node that is connected to different shunt lines
REF reflector
REF1 first reflector of a parallel resonator
RP parallel resonator
RS series resonator
SL shunt line
SLS1 first shunt line section
SM strip-type metallization
SR single resonator
TD transversal direction
WBB width of busbar

What is claimed is:

1. A SAW filter device, comprising:
a series resonator arranged in a series signal line;
a shunt line connected to a node situated in the series signal line relative to the series resonator; and
a parallel resonator arranged in the shunt line, wherein:
the shunt line comprises a broadened section located between the series resonator and the parallel resonator, and
a busbar of the series resonator and the broadened section are formed from a same metallization.

2. The SAW filter device of claim 1, wherein the parallel resonator comprises a reflector formed from the same metallization as the busbar of the series resonator and the broadened section.

3. The SAW filter device of claim 2, wherein the reflector is formed at least in part from the broadened section.

4. The SAW filter device of claim 2, wherein the reflector is positioned between the series resonator and the parallel resonator.

5. The SAW filter device of claim 1, wherein the series resonator is a first series resonator, the SAW filter device further comprising a second series resonator arranged in the series signal line, wherein the first series resonator and the second series resonator are connected via a common busbar extending over a length of the first series resonator and the second series resonator.

6. The SAW filter device of claim 5, wherein a lateral extension of the common busbar forms a first section of the shunt line.

7. The SAW filter device of claim 6, wherein the lateral extension of the common busbar forms a busbar of the parallel resonator.

8. The SAW filter device of claim 1, wherein a busbar of the parallel resonator is formed from the same metallization as the busbar of the series resonator and the broadened section.

9. The SAW filter device of claim 1, wherein the parallel resonator has a length measured in a longitudinal direction corresponding to a wave propagation direction and a width measured in a transversal direction.

10. The SAW filter device of claim 1, further comprising a plurality of series resonators arranged in the series signal line, the plurality of series resonators including the series resonator,
   wherein the plurality of series resonators are aligned one below the other in a line parallel to a transversal direction associated with a width of the plurality of series resonators,
   wherein reflectors of the plurality of series resonators are formed from a strip-type metallization extending over a combined length of the plurality of series resonators.

11. The SAW filter device of claim 1, further comprising a plurality of series resonators arranged in the series signal line, the plurality of series resonators including the series resonator,
   wherein the plurality of series resonators are arranged between a first node and a last node in the series signal line and are each cascaded by a series connection of two single resonators, and
   wherein respective reflectors of the plurality of series resonators are common to the two single resonators and extend over a total width of the two single resonators.

12. The SAW filter device of claim 1, wherein the series resonator is next to an input/output (I/O) terminal, and wherein a reflector of the series resonator, the busbar of the series resonator, and the I/O terminal are formed from the same metallization.

13. The SAW filter device of claim 1, further comprising a plurality of series resonators arranged in the series signal line, the plurality of series resonators including the series resonator,
   wherein each series resonator of the plurality of series resonators is cascaded by a series connection of a respective pair of single resonators, and
   wherein reflectors of each respective pair of single resonators are electrically isolated from each other.

14. The SAW filter device of claim 13, wherein the SAW filter device is a transmit filter, wherein an input/output (I/O) terminal of the transmit filter is a transmit terminal, and wherein a second series resonator that is next to the transmit terminal is un-cascaded and has a length that is at least a twofold length of one or more of the plurality of series resonators of the transmit filter.

* * * * *